US012635271B2

(12) United States Patent
Takeuchi et al.

(10) Patent No.: US 12,635,271 B2
(45) Date of Patent: May 19, 2026

(54) METHOD FOR MAKING IMAGE SENSOR DEVICES INCLUDING A SUPERLATTICE

(71) Applicant: Atomera Incorporated, Los Gatos, CA (US)

(72) Inventors: Hideki Takeuchi, San Jose, CA (US); Yi-Ann Chen, Campbell, CA (US); Nyles Wynn Cody, Tempe, AZ (US)

(73) Assignee: ATOMERA INCORPORATED, Los Gatos, CA (US)

( * ) Notice: Subject to any disclaimer, the term of this patent is extended or adjusted under 35 U.S.C. 154(b) by 466 days.

(21) Appl. No.: 18/192,338

(22) Filed: Mar. 29, 2023

(65) Prior Publication Data

US 2024/0072096 A1 Feb. 29, 2024

Related U.S. Application Data

(60) Provisional application No. 63/400,127, filed on Aug. 23, 2022.

(51) Int. Cl.
H10F 39/00 (2025.01)
H10F 39/18 (2025.01)

(52) U.S. Cl.
CPC ....... H10F 39/1825 (2025.01); H10F 39/014 (2025.01); H10F 39/024 (2025.01);
(Continued)

(58) Field of Classification Search
CPC .............. H10F 39/1825; H10F 39/014; H10F 39/8033
See application file for complete search history.

(56) References Cited

U.S. PATENT DOCUMENTS

| | | | |
|---|---|---|---|
| 4,937,204 A | 6/1990 | Ishibashi et al. | |
| 5,216,262 A | 6/1993 | Tsu | |
| | (Continued) | | |

FOREIGN PATENT DOCUMENTS

| | | | | |
|---|---|---|---|---|
| CN | 115050766 A | * 9/2022 | ............. | H10F 39/18 |
| DE | 19720629 A1 | * 11/1998 | ........... | H10F 30/223 |
| | (Continued) | | | |

OTHER PUBLICATIONS

R. Tsu "Phenomena in silicon nanostructure device" published online Sep. 6, 2000 by Applied Physics and Materials Science & Processing, pp. 391-402.
(Continued)

*Primary Examiner* — William B Partridge
*Assistant Examiner* — Felix B Andrews
(74) *Attorney, Agent, or Firm* — ALLEN, DYER, DOPPELT, GILCHRIST

(57) ABSTRACT

A method for making an image sensor device may include forming a pixel region within a semiconductor substrate comprising a first dopant having a first conductivity type, forming a first pinning layer on a surface of the substrate and including a second dopant having a second conductivity type different the first conductivity type, and forming a second pinning layer in the semiconductor substrate adjacent at least one side of the pixel region and including a superlattice and the second dopant. The superlattice may include a plurality of stacked groups of layers, with each group of layers comprising a plurality of stacked base semiconductor mono-layers defining a base semiconductor portion, and at least one non-semiconductor monolayer constrained within a crystal lattice of adjacent base semiconductor portions.

26 Claims, 14 Drawing Sheets

(52) U.S. Cl.
CPC ..... *H10F 39/8053* (2025.01); *H10F 39/8063*
(2025.01); *H10F 39/807* (2025.01)

(56) References Cited

U.S. PATENT DOCUMENTS

| | | | |
|---|---|---|---|
| 5,357,119 | A | 10/1994 | Wang et al. |
| 5,683,934 | A | 11/1997 | Candelaria |
| 5,796,119 | A | 8/1998 | Seabaugh |
| 6,376,337 | B1 | 4/2002 | Wang et al. |
| 6,447,933 | B1 | 9/2002 | Wang et al. |
| 6,472,685 | B2 | 10/2002 | Takagi |
| 6,741,624 | B2 | 5/2004 | Mears et al. |
| 6,830,964 | B1 | 12/2004 | Mears et al. |
| 6,833,294 | B1 | 12/2004 | Mears et al. |
| 6,878,576 | B1 | 4/2005 | Mears et al. |
| 6,891,188 | B2 | 5/2005 | Mears et al. |
| 6,897,472 | B2 | 5/2005 | Mears et al. |
| 6,927,413 | B2 | 8/2005 | Mears et al. |
| 6,952,018 | B2 | 10/2005 | Mears et al. |
| 6,958,486 | B2 | 10/2005 | Mears et al. |
| 6,993,222 | B2 | 1/2006 | Mears et al. |
| 7,018,900 | B2 | 3/2006 | Kreps |
| 7,033,437 | B2 | 4/2006 | Mears et al. |
| 7,034,329 | B2 | 4/2006 | Mears et al. |
| 7,045,377 | B2 | 5/2006 | Mears et al. |
| 7,045,813 | B2 | 5/2006 | Mears et al. |
| 7,071,119 | B2 | 7/2006 | Mears et al. |
| 7,105,895 | B2 | 9/2006 | Wang et al. |
| 7,109,052 | B2 | 9/2006 | Mears et al. |
| 7,123,792 | B1 | 10/2006 | Mears et al. |
| 7,148,712 | B1 | 12/2006 | Prey, Jr. et al. |
| 7,153,763 | B2 | 12/2006 | Hytha et al. |
| 7,202,494 | B2 | 4/2007 | Blanchard et al. |
| 7,227,174 | B2 | 6/2007 | Mears et al. |
| 7,229,902 | B2 | 6/2007 | Mears et al. |
| 7,265,002 | B2 | 9/2007 | Mears et al. |
| 7,279,699 | B2 | 10/2007 | Mears et al. |
| 7,279,701 | B2 | 10/2007 | Kreps |
| 7,288,457 | B2 | 10/2007 | Kreps |
| 7,303,948 | B2 | 12/2007 | Mears et al. |
| 7,402,512 | B2 | 7/2008 | Derraa et al. |
| 7,432,524 | B2 | 10/2008 | Mears et al. |
| 7,435,988 | B2 | 10/2008 | Mears et al. |
| 7,436,026 | B2 | 10/2008 | Kreps |
| 7,446,002 | B2 | 11/2008 | Mears et al. |
| 7,446,334 | B2 | 11/2008 | Mears et al. |
| 7,491,587 | B2 | 2/2009 | Rao |
| 7,514,328 | B2 | 4/2009 | Rao |
| 7,517,702 | B2 | 4/2009 | Halilov et al. |
| 7,531,828 | B2 | 5/2009 | Mears et al. |
| 7,531,829 | B2 | 5/2009 | Blanchard |
| 7,531,850 | B2 | 5/2009 | Blanchard |
| 7,535,041 | B2 | 5/2009 | Blanchard |
| 7,586,116 | B2 | 9/2009 | Kreps et al. |
| 7,586,165 | B2 | 9/2009 | Blanchard |
| 7,598,515 | B2 | 10/2009 | Mears et al. |
| 7,612,366 | B2 | 11/2009 | Mears et al. |
| 7,625,767 | B2 | 12/2009 | Huang et al. |
| 7,659,539 | B2 | 2/2010 | Kreps et al. |
| 7,700,447 | B2 | 4/2010 | Dukovski et al. |
| 7,718,996 | B2 | 5/2010 | Dukovski et al. |
| 7,781,827 | B2 | 8/2010 | Rao |
| 7,812,339 | B2 | 10/2010 | Mears et al. |
| 7,863,066 | B2 | 1/2011 | Mears et al. |
| 7,880,161 | B2 | 2/2011 | Mears et al. |
| 7,928,425 | B2 | 4/2011 | Rao |
| 8,389,974 | B2 | 3/2013 | Mears et al. |
| 9,275,996 | B2 | 3/2016 | Mears et al. |
| 9,406,753 | B2 | 8/2016 | Mears et al. |
| 9,558,939 | B1 | 1/2017 | Stephenson et al. |
| 9,716,147 | B2 | 7/2017 | Mears |
| 9,721,790 | B2 | 8/2017 | Mears et al. |
| 9,722,046 | B2 | 8/2017 | Mears et al. |
| 9,899,479 | B2 | 2/2018 | Mears et al. |
| 9,941,359 | B2 | 4/2018 | Mears et al. |
| 9,972,685 | B2 | 5/2018 | Mears et al. |
| 10,084,045 | B2 | 9/2018 | Mears et al. |
| 10,107,854 | B2 | 10/2018 | Roy |
| 10,109,342 | B2 | 10/2018 | Roy |
| 10,109,479 | B1 | 10/2018 | Mears et al. |
| 10,170,560 | B2 | 1/2019 | Mears |
| 10,170,603 | B2 | 1/2019 | Mears et al. |
| 10,170,604 | B2 | 1/2019 | Mears et al. |
| 10,191,105 | B2 | 1/2019 | Roy |
| 10,249,745 | B2 | 4/2019 | Mears et al. |
| 10,276,625 | B1 | 4/2019 | Mears et al. |
| 10,304,881 | B1 | 5/2019 | Chen et al. |
| 10,355,151 | B2 | 7/2019 | Chen et al. |
| 10,361,243 | B2 | 7/2019 | Mears et al. |
| 10,367,028 | B2 | 7/2019 | Chen et al. |
| 10,367,064 | B2 | 7/2019 | Rao |
| 10,381,242 | B2 | 8/2019 | Takeuchi |
| 10,396,223 | B2 | 8/2019 | Chen et al. |
| 10,410,880 | B2 | 9/2019 | Takeuchi |
| 10,453,945 | B2 | 10/2019 | Mears et al. |
| 10,461,118 | B2 | 10/2019 | Chen et al. |
| 10,468,245 | B2 | 11/2019 | Weeks et al. |
| 10,504,956 | B2 | 12/2019 | Goto et al. |
| 10,529,757 | B2 | 1/2020 | Chen et al. |
| 10,529,768 | B2 | 1/2020 | Chen et al. |
| 10,566,191 | B1 | 2/2020 | Weeks et al. |
| 10,580,866 | B1 | 3/2020 | Takeuchi et al. |
| 10,580,867 | B1 | 3/2020 | Takeuchi et al. |
| 10,593,761 | B1 | 3/2020 | Takeuchi et al. |
| 10,608,027 | B2 | 3/2020 | Chen et al. |
| 10,608,043 | B2 | 3/2020 | Chen et al. |
| 10,615,209 | B2 | 4/2020 | Chen et al. |
| 10,636,879 | B2 | 4/2020 | Rao |
| 10,727,049 | B2 | 7/2020 | Weeks et al. |
| 10,741,436 | B2 | 8/2020 | Stephenson et al. |
| 10,763,370 | B2 | 9/2020 | Stephenson |
| 10,777,451 | B2 | 9/2020 | Stephenson et al. |
| 10,811,498 | B2 | 10/2020 | Weeks et al. |
| 10,818,755 | B2 | 10/2020 | Takeuchi et al. |
| 10,825,901 | B1 | 11/2020 | Burton et al. |
| 10,825,902 | B1 | 11/2020 | Burton et al. |
| 10,840,335 | B2 | 11/2020 | Takeuchi et al. |
| 10,840,336 | B2 | 11/2020 | Connelly et al. |
| 10,840,337 | B2 | 11/2020 | Takeuchi et al. |
| 10,840,388 | B1 | 11/2020 | Burton et al. |
| 10,847,618 | B2 | 11/2020 | Takeuchi et al. |
| 10,854,717 | B2 | 12/2020 | Takeuchi et al. |
| 10,868,120 | B1 | 12/2020 | Burton et al. |
| 10,879,356 | B2 | 12/2020 | Stephenson et al. |
| 10,879,357 | B1 | 12/2020 | Burton et al. |
| 10,884,185 | B2 | 1/2021 | Stephenson |
| 10,937,868 | B2 | 3/2021 | Burton et al. |
| 10,937,888 | B2 | 3/2021 | Burton et al. |
| 11,075,078 | B1 | 7/2021 | Cody et al. |
| 11,094,818 | B2 | 8/2021 | Takeuchi et al. |
| 11,177,351 | B2 | 11/2021 | Weeks et al. |
| 11,183,565 | B2 | 11/2021 | Burton et al. |
| 11,302,823 | B2 | 4/2022 | Weeks et al. |
| 11,329,154 | B2 | 5/2022 | Takeuchi et al. |
| 11,355,667 | B2 | 6/2022 | Stephenson |
| 11,387,325 | B2 | 7/2022 | Stephenson et al. |
| 11,430,869 | B2 | 8/2022 | Weeks et al. |
| 11,437,486 | B2 | 9/2022 | Burton |
| 11,437,487 | B2 | 9/2022 | Burton |
| 11,469,302 | B2 | 10/2022 | Takeuchi et al. |
| 11,569,368 | B2 | 1/2023 | Takeuchi et al. |
| 2003/0034529 | A1 | 2/2003 | Fitzgerald et al. |
| 2003/0057416 | A1 | 3/2003 | Currie et al. |
| 2004/0262594 | A1 | 12/2004 | Mears et al. |
| 2004/0266116 | A1 | 12/2004 | Mears |
| 2005/0029510 | A1 | 2/2005 | Mears et al. |
| 2005/0032241 | A1 | 2/2005 | Mears et al. |
| 2005/0279991 | A1 | 12/2005 | Mears et al. |
| 2005/0282330 | A1 | 12/2005 | Mears et al. |
| 2006/0011905 | A1 | 1/2006 | Mears et al. |
| 2006/0220118 | A1 | 10/2006 | Stephenson et al. |
| 2006/0223215 | A1 | 10/2006 | Blanchard |
| 2006/0231857 | A1 | 10/2006 | Blanchard |
| 2006/0243964 | A1 | 11/2006 | Kreps et al. |

(56) References Cited

U.S. PATENT DOCUMENTS

| | | | |
|---|---|---|---|
| 2006/0263980 A1 | 11/2006 | Kreps et al. | |
| 2006/0267130 A1 | 11/2006 | Rao | |
| 2006/0273299 A1 | 12/2006 | Stephenson et al. | |
| 2006/0289049 A1 | 12/2006 | Rao | |
| 2006/0292765 A1 | 12/2006 | Blanchard | |
| 2007/0007508 A1 | 1/2007 | Mears et al. | |
| 2007/0010040 A1 | 1/2007 | Mears et al. | |
| 2007/0012910 A1 | 1/2007 | Mears et al. | |
| 2007/0015344 A1 | 1/2007 | Mears et al. | |
| 2007/0020833 A1 | 1/2007 | Mears et al. | |
| 2007/0020860 A1 | 1/2007 | Mears et al. | |
| 2007/0063185 A1 | 3/2007 | Rao | |
| 2007/0063186 A1 | 3/2007 | Rao | |
| 2007/0158640 A1 | 7/2007 | Stephenson et al. | |
| 2007/0166928 A1 | 7/2007 | Halilov et al. | |
| 2007/0187667 A1 | 8/2007 | Halilov et al. | |
| 2008/0012004 A1 | 1/2008 | Huang et al. | |
| 2008/0157246 A1* | 7/2008 | Han | H10F 39/024 |
| | | | 257/E31.127 |
| 2010/0148289 A1 | 6/2010 | Mccarten et al. | |
| 2010/0270535 A1 | 10/2010 | Halilov et al. | |
| 2011/0215299 A1 | 9/2011 | Rao | |
| 2016/0197146 A1* | 7/2016 | Augusto | H10F 30/21 |
| | | | 257/22 |
| 2018/0047777 A1 | 2/2018 | Cheng et al. | |
| 2019/0058059 A1 | 2/2019 | Stephenson et al. | |
| 2019/0189652 A1 | 6/2019 | Chen et al. | |
| 2019/0189655 A1* | 6/2019 | Chen | H10F 39/024 |
| 2019/0319135 A1 | 10/2019 | Stephenson | |
| 2020/0135489 A1 | 4/2020 | Weeks et al. | |
| 2022/0005706 A1 | 1/2022 | Weeks et al. | |
| 2022/0005926 A1 | 1/2022 | Weeks et al. | |
| 2022/0005927 A1 | 1/2022 | Weeks et al. | |
| 2022/0238710 A1 | 7/2022 | Takeuchi et al. | |
| 2022/0285152 A1 | 9/2022 | Takeuchi et al. | |
| 2022/0285153 A1 | 9/2022 | Takeuchi et al. | |
| 2022/0285498 A1 | 9/2022 | Stephenson et al. | |
| 2022/0344155 A1 | 10/2022 | Hytha et al. | |
| 2022/0352322 A1 | 11/2022 | Hytha et al. | |
| 2022/0367675 A1 | 11/2022 | Burton | |
| 2022/0367676 A1 | 11/2022 | Burton | |
| 2022/0376047 A1 | 11/2022 | Mears et al. | |
| 2022/0384579 A1 | 12/2022 | Hytha et al. | |
| 2022/0384600 A1 | 12/2022 | Mears et al. | |
| 2022/0384612 A1 | 12/2022 | Hytha et al. | |

FOREIGN PATENT DOCUMENTS

| | | | | | |
|---|---|---|---|---|---|
| GB | 2347520 | | 6/2000 | | |
| KR | 20170045692 A | * | 4/2017 | | H01L 43/08 |
| TW | 1703716 B | * | 9/2020 | | |
| WO | 2010077315 | | 7/2010 | | |
| WO | WO-2023165869 A1 | * | 9/2023 | | H10F 39/014 |

OTHER PUBLICATIONS

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://// http://www3.interscience.wiley.com/cgi-bin/abstract/72512946/start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-channel Si an Ge MOSSFET performance" Department of Electrical Engineering and Computer Science, University of California, Berkeley, 2012, pp. 2. mearstech.net; retrieved from internet Jan. 18, 2016.

Maurizio Di Paolo Emilio "Quantum-Engineered Material Boosts Transistor Performance" https://www.eetimes.com/quantum-engineered-material-boosts-transistor-performance/#EE Times; retrieved from internet Feb. 10, 2022; pp. 3.

U.S. Appl. No. 17/452,604; filed Oct. 28, 2021 Hytha et al.

U.S. Appl. No. 17/452,610; filed Oct. 28, 2021 Hytha et al.

U.S. Appl. No. 18/069,278; filed Dec. 21, 2022 Weeks et al.

U.S. Appl. No. 18/069,287; filed Dec. 21, 2022 Weeks et al.

U.S. Appl. No. 18/192,371; filed Mar. 29, 2023 Takeuchi et al.

Ha et al. "Temporal Noise Improvement Using the Selective Application of the Fluorine Implantation in the CMOS Image Sensor" https://www.imagesensors.org/Past%20Workshops/2017%20Workshop/2017%20Papers/R09.pdf; pp. 3; Retrieved From Internet Mar. 30, 2023.

Mark Lapedus "Manufacturing, Packaging & Materials—Scaling CMOS Image Sensors" https://semiengineering.com/scaling-cmos-image-sensors/ Apr. 20, 2020; pp. 8.

Nobukazu Teranishi "Effect and Limitation of Pinned Photodiode" IEEE Transactions on Electron Devices ( vol. 63, Issue: 1, Jan. 2016) Abstract Only.

Ray Fontaine, "Part 3: Back-Illuminated Active Si Thickness, Deep Trench Isolation (DTI)" https://www.techinsights.com/blog/part-3-back-illuminated-active-si-thickness-deep-trench-isolation-dti: Jul. 23, 2019; pp. 4.

Raynal et al. "Wet and Siconi® cleaning sequences for SiGe p-type metal oxide semiconductor channels" Microelectronic engineering: vols. 187-188, Feb. 5, 2018, pp. 84-89; Abstract Only.

Zaitsu et al. "A 2-Layer Transistor Pixel Stacked CMOS Image Sensor with Oxide-Based Full Trench Isolation for Large Full Well Capacity and High Quantum Efficiency" 2022 Symposium on VLSI Technology & Circuits Digest of Technical Papers: pp. 2.

* cited by examiner

METHOD FOR MAKING IMAGE SENSOR DEVICES INCLUDING A SUPERLATTICE

RELATED APPLICATIONS

This application claims the benefit of U.S. provisional application No. 63/400,127 filed Aug. 23, 2022, which is hereby incorporated herein in its entirety by reference.

TECHNICAL FIELD

The present disclosure generally relates to semiconductor devices, and, more particularly, to semiconductor image sensor devices and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making an image sensor device may include forming a pixel region within a semiconductor substrate comprising a first dopant having a first conductivity type, forming a first pinning layer on a surface of the substrate and including a second dopant having a second conductivity type different the first conductivity type, and forming a second pinning layer in the semiconductor substrate adjacent at least one side of the pixel region and including a superlattice and the second dopant. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions.

In an example embodiment, the second pinning layer may extend along opposite sides of the pixel region. More particularly, the second pinning layer may also extend along a bottom of the pixel region. In accordance with another example implementation, the method may further include forming an isolation region in the semiconductor substrate adjacent the second pinning layer. Moreover, the second pinning layer may wrap around the isolation region.

The first pinning layer may be adjacent a first end of the pixel region, and the method may further include forming a color filter layer on the substrate adjacent a second end of the pixel region opposite the first end. Moreover, the method may also include forming a lens on the color filter layer.

In one example embodiment, the method may further include forming a transfer gate adjacent the first pinning layer, forming a conductive contact spaced apart from the transfer gate, and forming a conductive via extending between the transfer gate and the conductive contact. Furthermore, the second pinning layer may also include fluorine in some embodiments. By way of example, the base semiconductor portion may comprise silicon, and the at least one non-semiconductor monolayer may comprise oxygen.

In some implementations, forming the pixel region may include forming an intrinsic region, and forming a doped region including the first dopant in the intrinsic region with the intrinsic region separating the doped region and the second pinning layer. In an example embodiment, the superlattice may comprise a first superlattice, and forming the pixel region may further include forming a second superlattice in the intrinsic portion, similar to the one described briefly above. The second superlattice may at least partially surround the doped region in some implementations.

DETAILED DESCRIPTION

Figure 1:
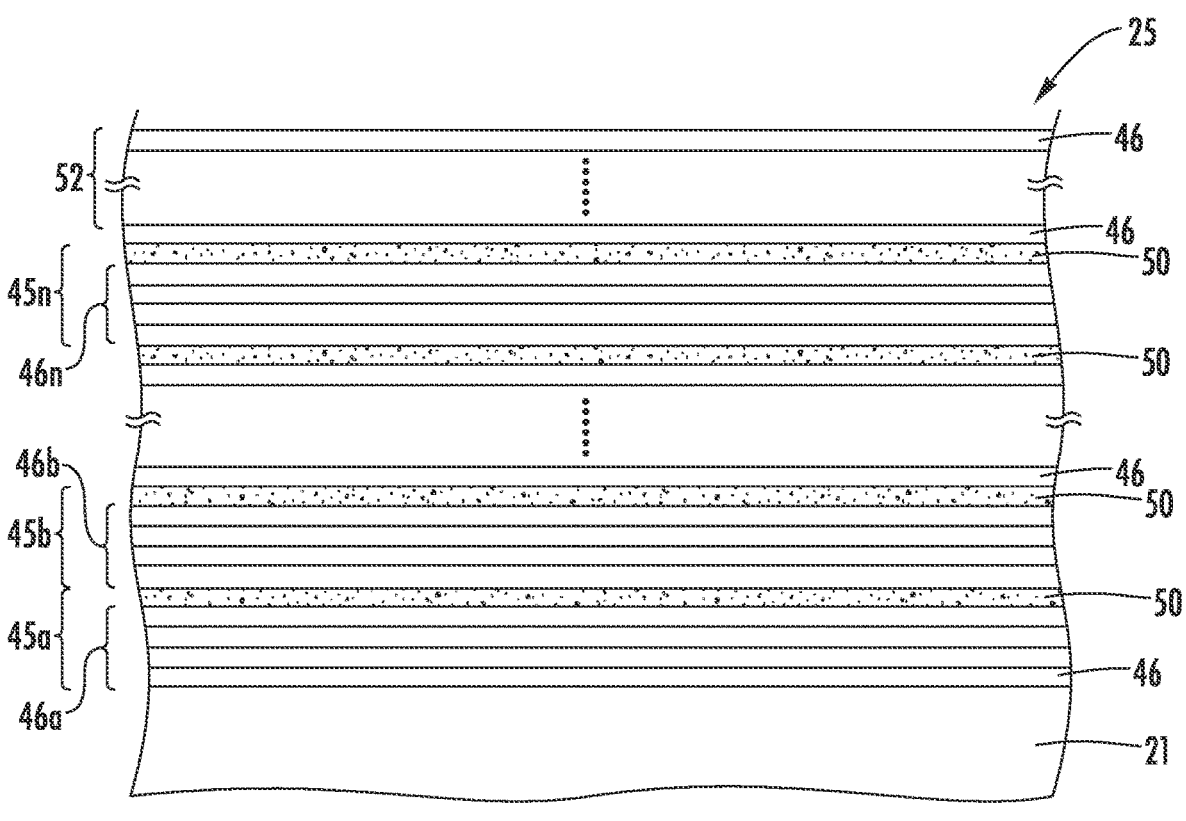
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to semiconductor devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $$M_e^{-1} \text{ and } M_h^{-1}$$

electrons and holes respectively, defined as:

$$M_{e,ij}^{-1}(E_F, T) = \frac{\sum\limits_{E>E_F} \int\limits_{B.Z.} (\nabla_k E(k, n))_i (\nabla_k E(k, n))_j \dfrac{\partial f(E(k, n), E_F, T)}{\partial E} d^3k}{\sum\limits_{E>E_F} \int\limits_{B.Z.} f(E(k, n), E_F, T) d^3k}$$

for electrons and:

$$M_{h,ij}^{-1}(E_F, T) = \frac{-\sum\limits_{E<E_F} \int\limits_{B.Z.} (\nabla_k E(k, n))_i (\nabla_k E(k, n))_j \dfrac{\partial f(E(k, n), E_F, T)}{\partial E} d^3k}{\sum\limits_{E<E_F} \int\limits_{B.Z.} (1 - f(E(k, n), E_F, T)) d^3k}$$

for holes, where f is the Fermi-Dirac distribution, $E_F$ is the Fermi energy, T is the temperature, $E(k,n)$ is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
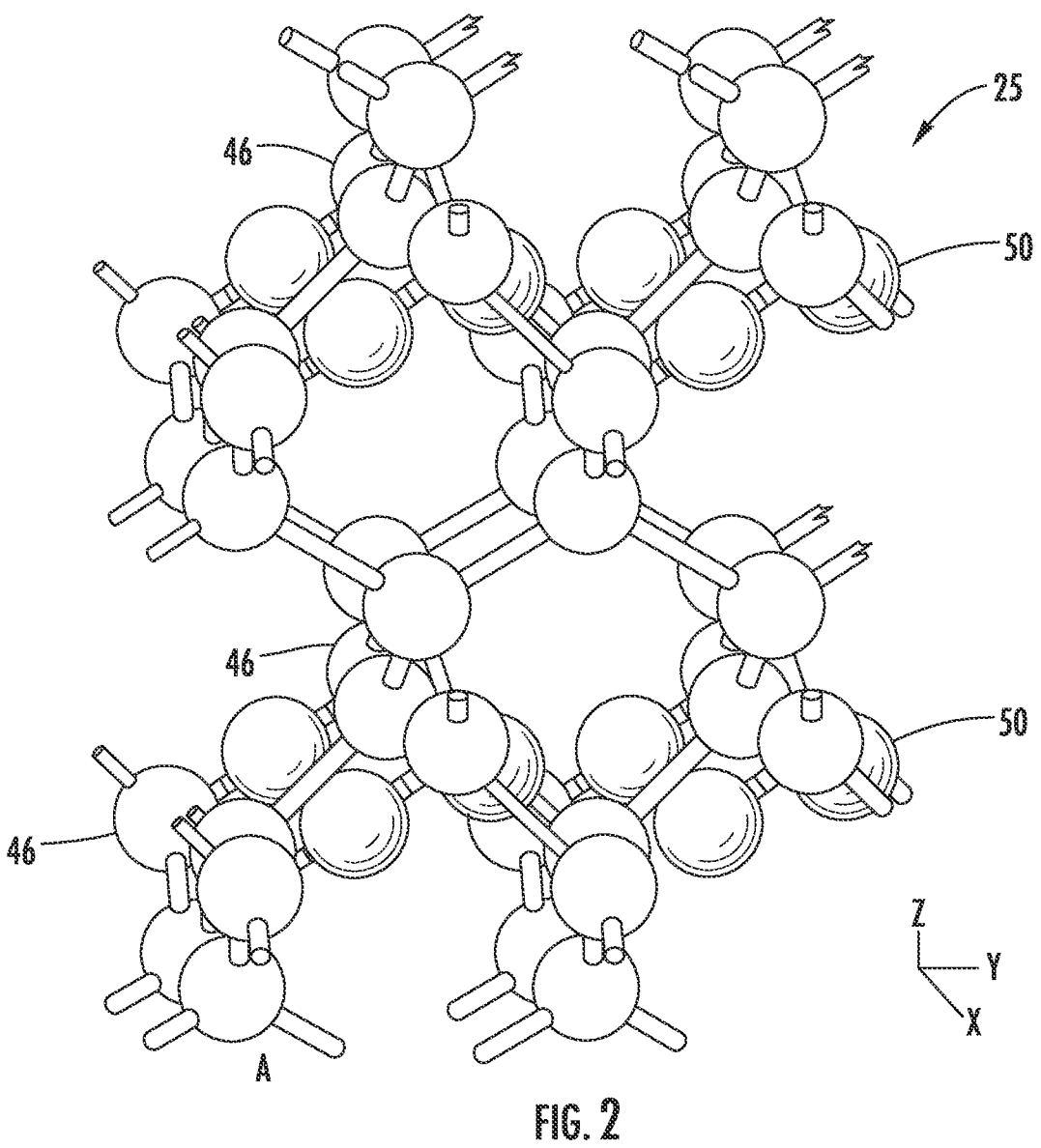
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
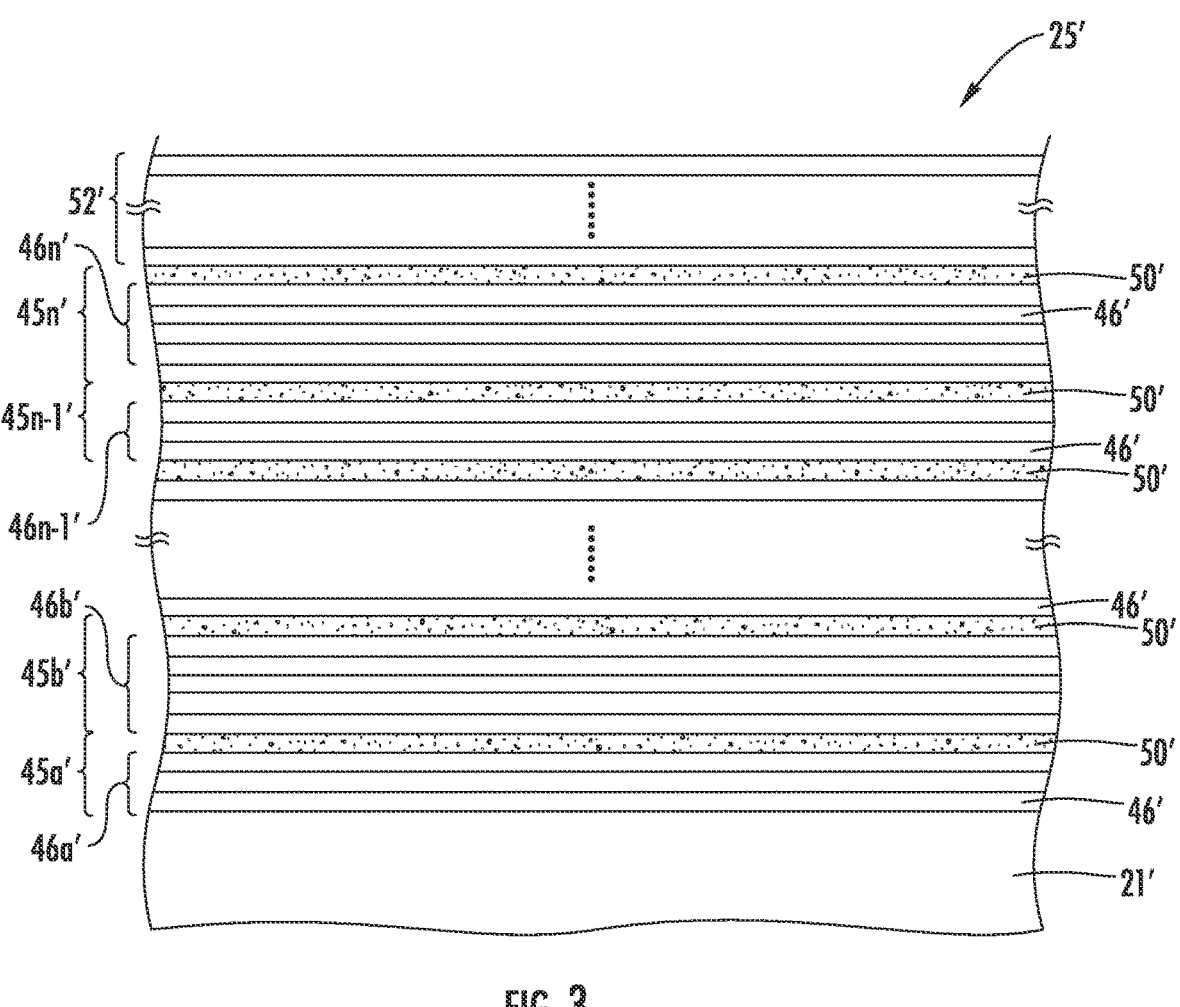
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
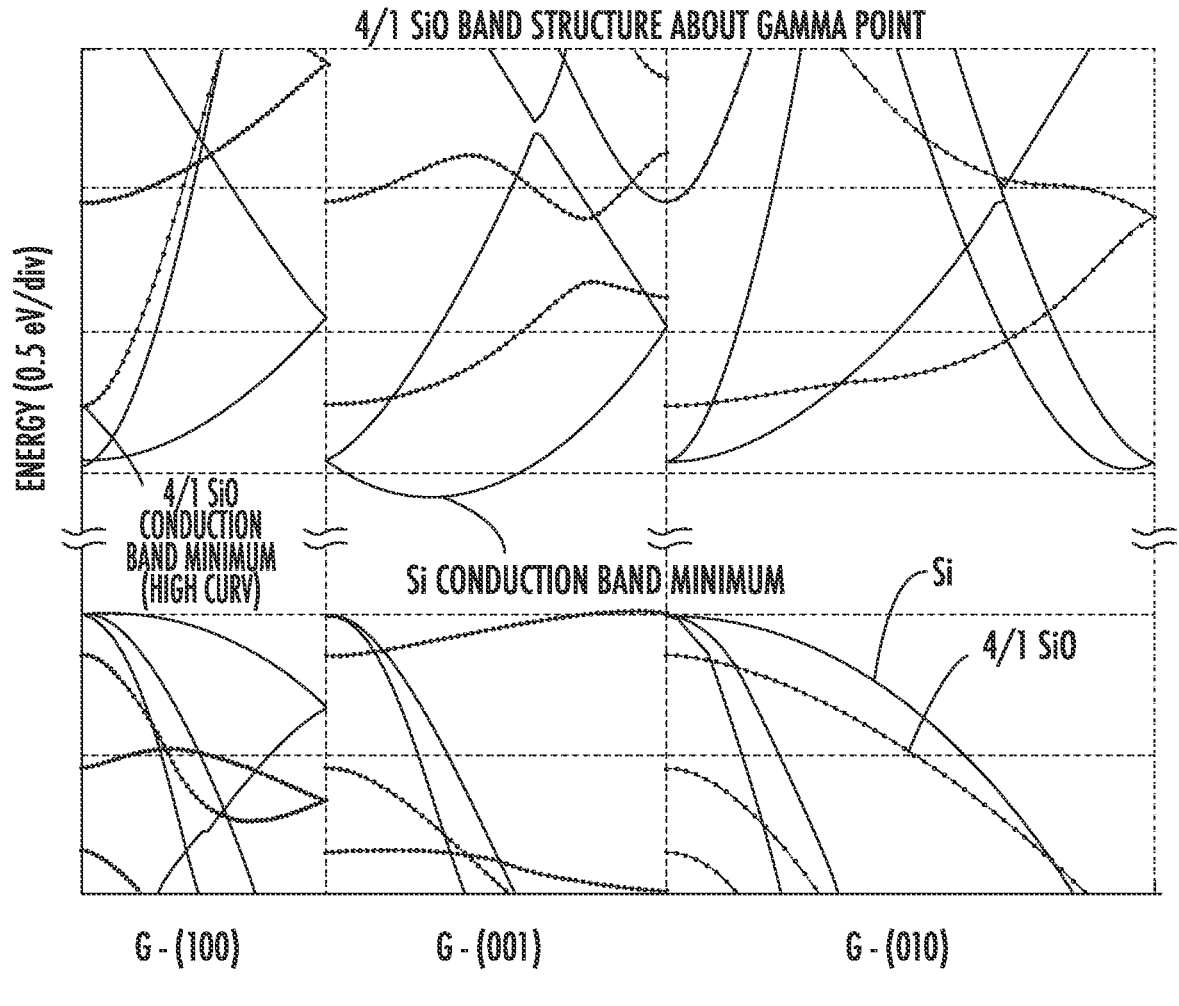
FIG. 4A is a graph of the calculated band structure from the gamma point (G) for both bulk silicon as in the prior art, and for the 4/1 Si/O superlattice as shown in FIGS. 1-2.
Figure 4B:
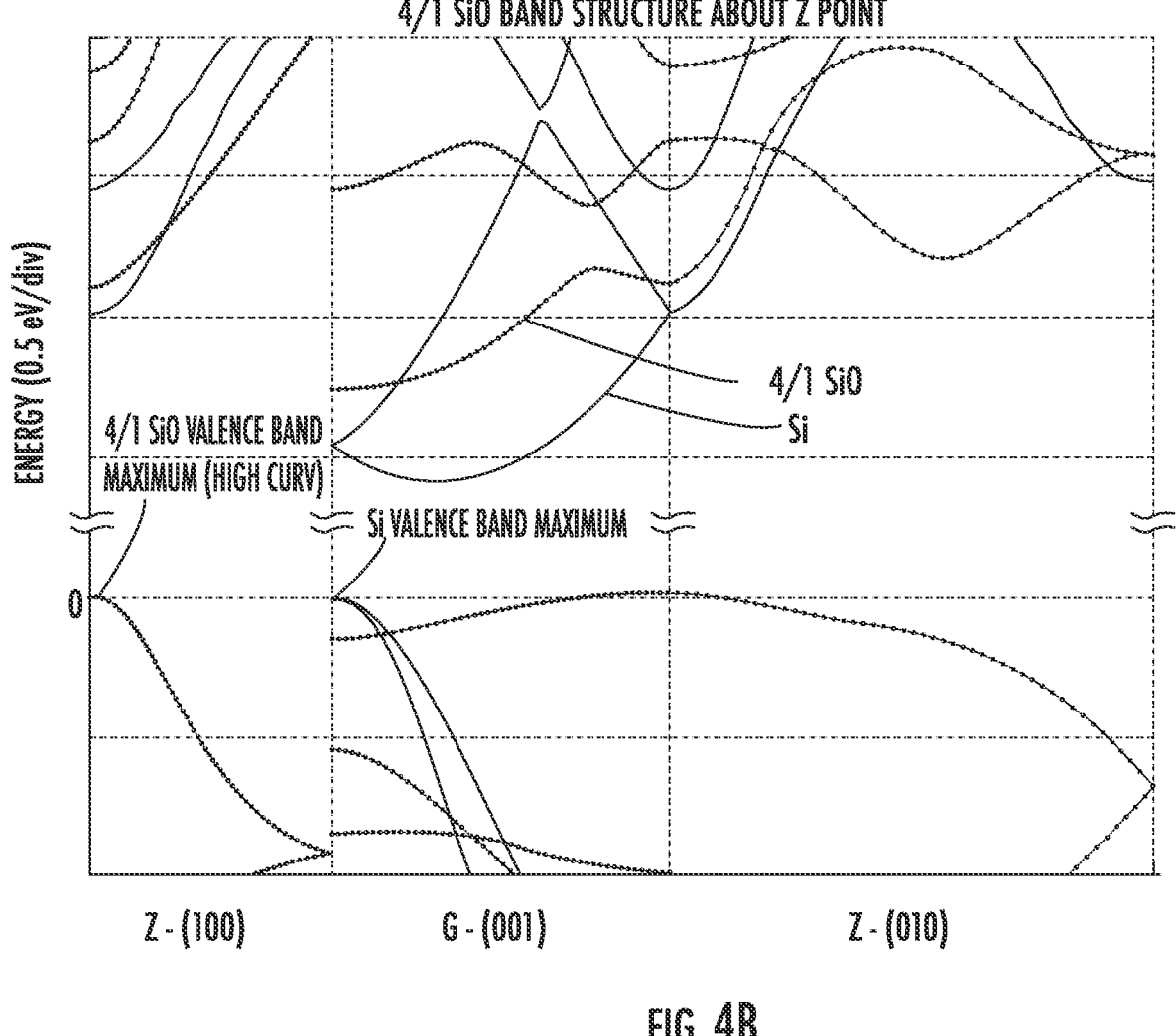
FIG. 4B is a graph of the calculated band structure from the Z point for both bulk silicon as in the prior art, and for the 4/1 Si/O superlattice as shown in FIGS. 1-2.
Figure 4C:
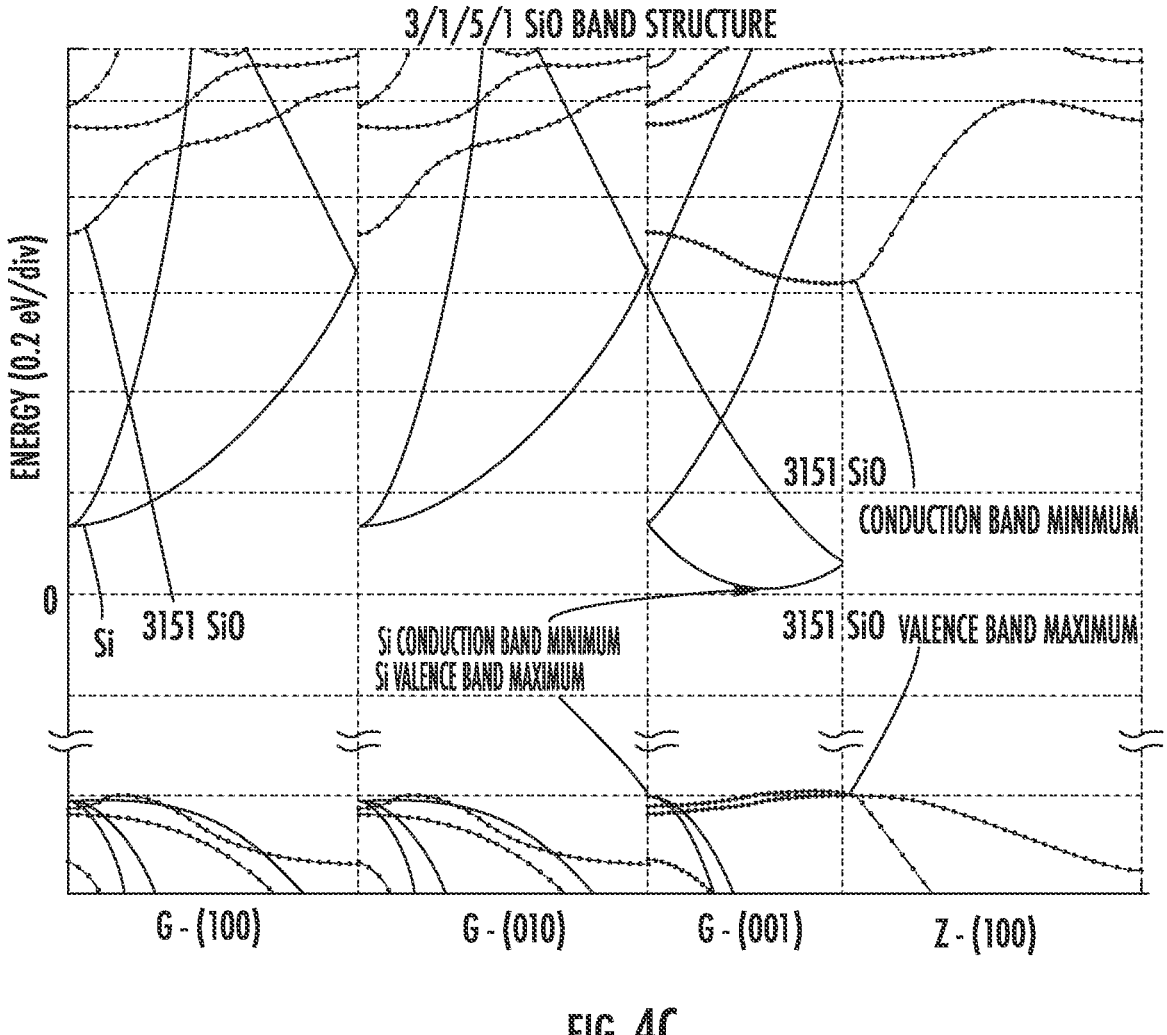
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e., perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
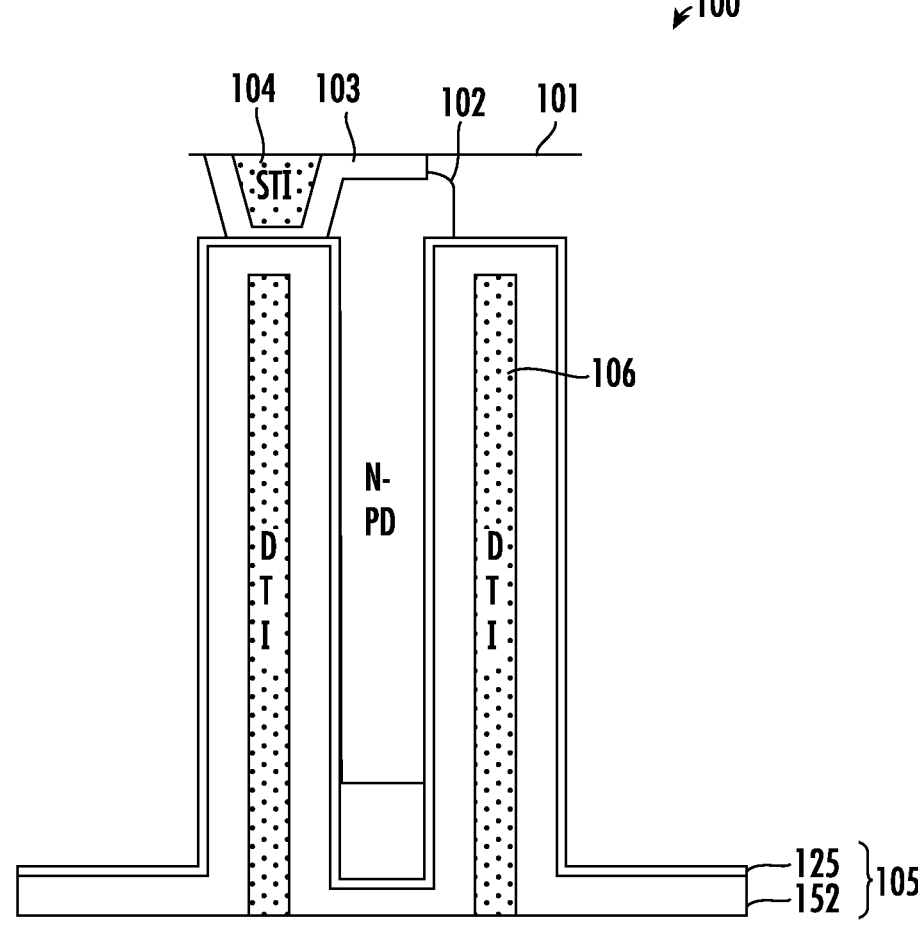
FIG. 5 is a schematic cross-sectional diagram of an image sensor device in accordance with an example embodiment.

Referring now additionally to FIG. 5, the above-described superlattice structures may advantageously be used in the fabrication of semiconductor image sensors such as the illustrated pinned photodiode (PPD) device 100. By way of background, challenges exist in the scaling of CMOS image sensors as device dimensions shrink. Various approaches are used to help address these challenges, such as deep trench isolation (DTI), fluorine passivation of interface states, low temperature surface treatment prior to low temperature epitaxy, and high-k film passivation for negative charge introduction. However, such processes may have other drawbacks, such as issues created by metals in high-k (metal oxide) films.

In the illustrated example, the image sensor device 100 illustratively includes a semiconductor substrate 101, a pixel region 102 within the semiconductor substrate and with a first dopant having a first conductivity type (N-type in the present example). A first pinning layer 103 on a surface of the substrate 101 includes a second dopant having a second conductivity type different the first conductivity type (P-type in the present example). A shallow trench isolation (STI)

region 104 is within the first pinning layer 103. Furthermore, a second pinning layer 105 in the semiconductor substrate 101 is adjacent one or more sides of the pixel region 102 and illustratively includes a superlattice 125 and semiconductor layer 152 also having the second dopant. The superlattice 125 may be as described further above.

In the illustrated example, the second pinning layer extends along deep trench isolation (DTI) regions 106, the pixel region 102, and backside regions of the device 100, which may provide several advantages over conventional approaches. In accordance with one example implementation, the second pinning layer 105 may be formed as a p+ pinning layer by in-situ boron doped Si epitaxy after a deep trench etch, as will be discussed further below. The second (p+) pinning layer 105 incorporates the superlattice layer 125 to advantageously provide for dopant diffusion blocking as between the second pinning layer and the pixel region 102, as well as to help retain these dopants in place to maintain desired operating characteristics. Further details regarding the use of superlattice structures for dopant blocking and retention applications are set forth in U.S. Pat. Nos. 10,847,618 and 10,825,901, which are also assigned to the present Applicant and are hereby incorporated herein in their entireties by reference.

The second pinning layer 105 may also provide an electrical connection to the first p+ pinning layer 103 at the surface of the substrate 101 to form a built-in potential between n-type photodiodes. This advantageously helps avoid the need for high-k films, to thereby reduce a likelihood of unwanted metal diffusion into the photodiode region, for example.

Figure 6:
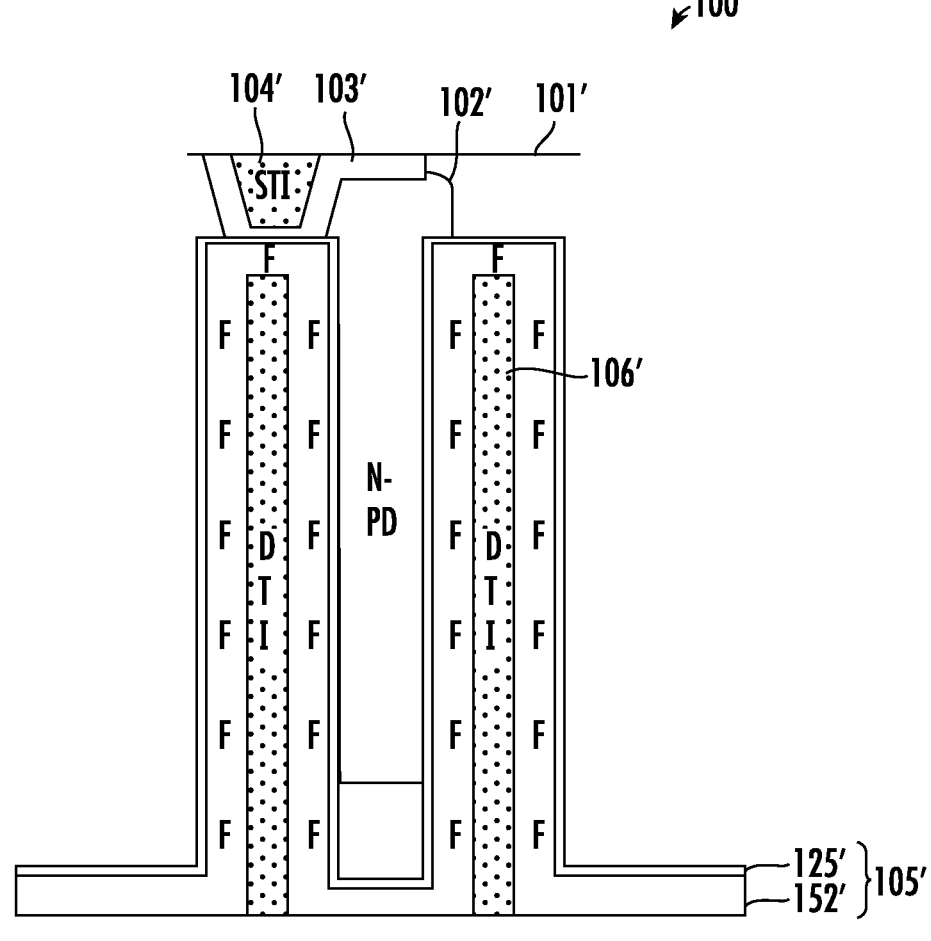
FIG. 6 is a schematic cross-sectional diagram of an image sensor device in accordance with another example embodiment.

Referring additionally to FIG. 6, in an alternative embodiment of the image sensor device 100', during the second pinning layer 105' formation, deposition of a partial monolayer(s) of fluorine may be performed. For example, fluorine may be diffused into the oxide/silicon interface (in the case of an Si/O superlattice 125') during the oxide deposition process to passivate Si dangling bonds at the interface. Passivation of dangling bonds may lead to a reduction of G-R centers, and thus a reduction of dark current, as will be appreciated by those skilled in the art. The remaining elements 101', 102', 103', 104', 106', and 152' may be similar to those discussed with reference to FIG. 5 above.

One example low-temperature Si epitaxy process to form the second (p+) pinning layer 105 described above is as follows. Native oxide removal is performed by introducing radicals formed by remote plasma of NH3+NF3 at a temperature in the range of 150-250° C. Hydrogen passivation of the Si surface is performed by introducing radicals formed by remote plasma of $H_2$ at 350-500° C. Si epitaxy with oxygen monolayer insertion (for an Si/O MST film) is performed to form the superlattice 125. By way of example, a Si precursor of $Si_2H_6$ or $Si_3H_8$ at a temperature of 400-550° C. may be used. The oxygen source may be diluted $O_2$ or oxygen radicals formed by remote plasma of $O_2$ gas at a temperature in the range of 250-600° C., for example. In-situ boron-doped Si epitaxy may be performed to a thickness of 5 to 30 nm at a temperature in the range of 350-450° C., for example. Example source gasses include $B_2H_6+Si_2H_6$ or $Si_3H_8$. In the case of the second pinning layer 105', Si epitaxy with a fluorine-insertion monolayer(s) may be performed with an Si epitaxy process at 400-450° C. with $Si_2H_6$ or $Si_3H_8$, for example. Sub-monolayer fluorine doping may be performed at a temperature in a range of 200-400° C. with diluted $SF_6$, or 250-550° C. with remote plasma $NF_3$, for example.

Figures 7A, 7B, 7C, 7D:
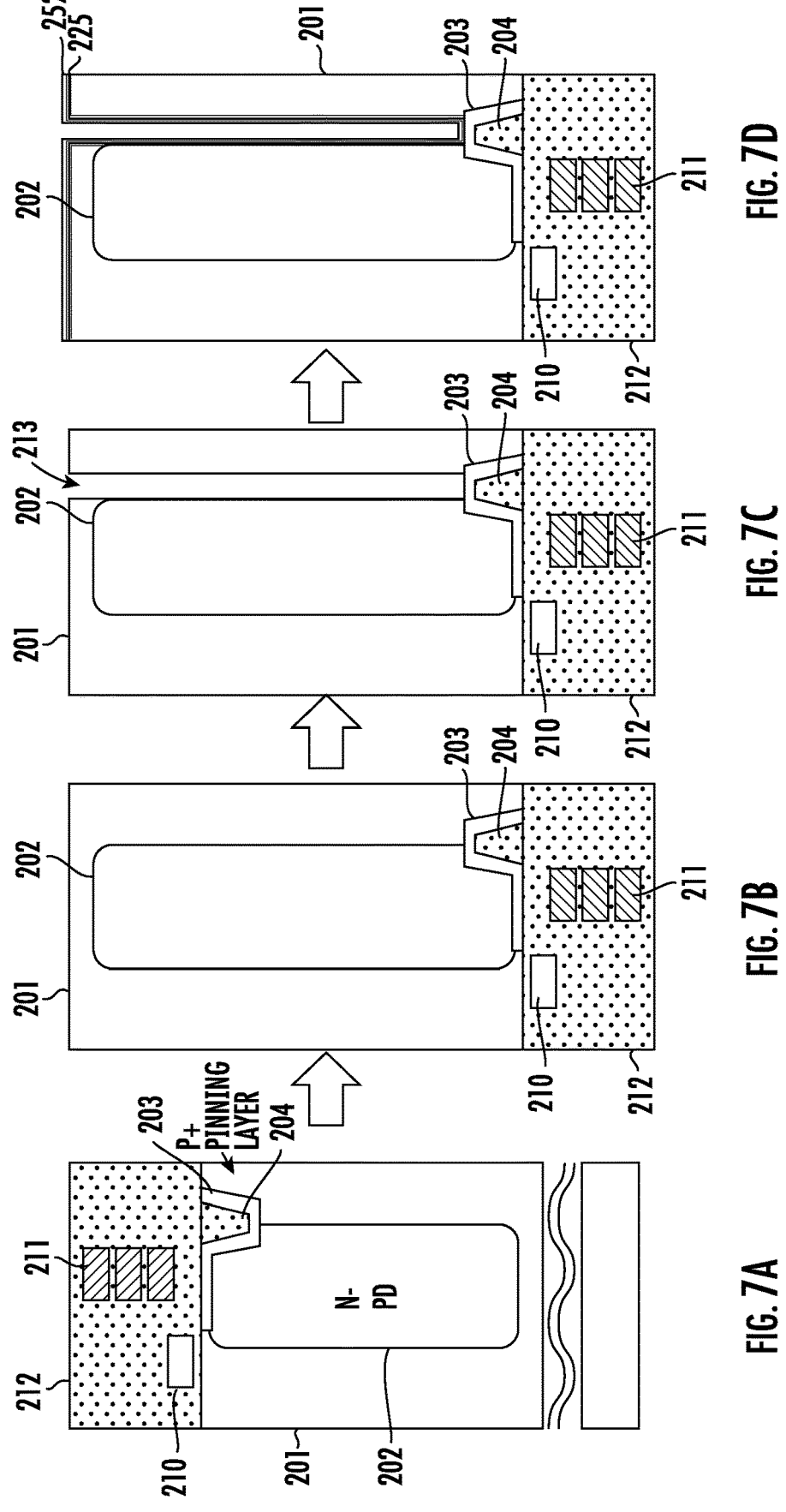
FIGS. 7A-7E are a series of cross-sectional diagrams illustrating a method of making an image sensor device in accordance with an example embodiment.
Figure 7E:
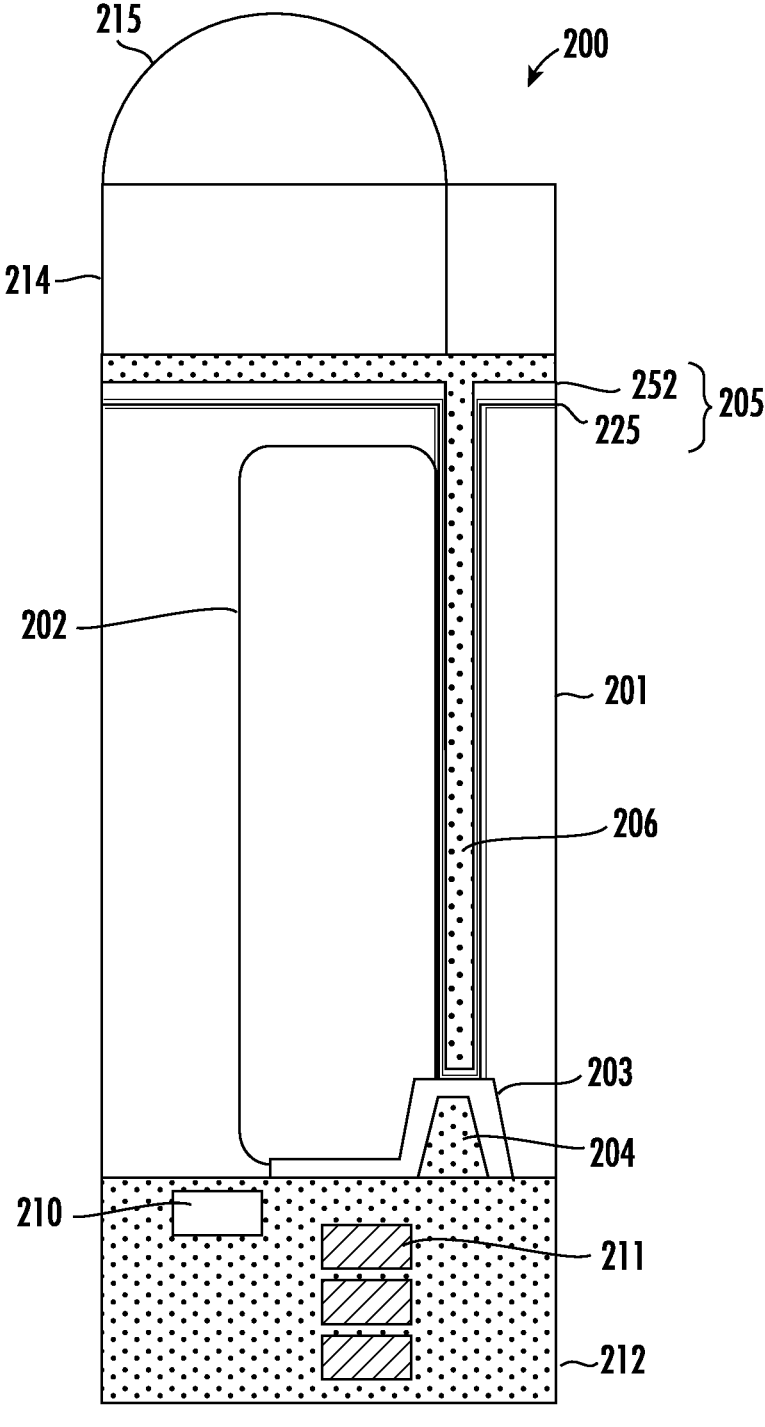
Figures 8A, 8B, 8C, 8D:
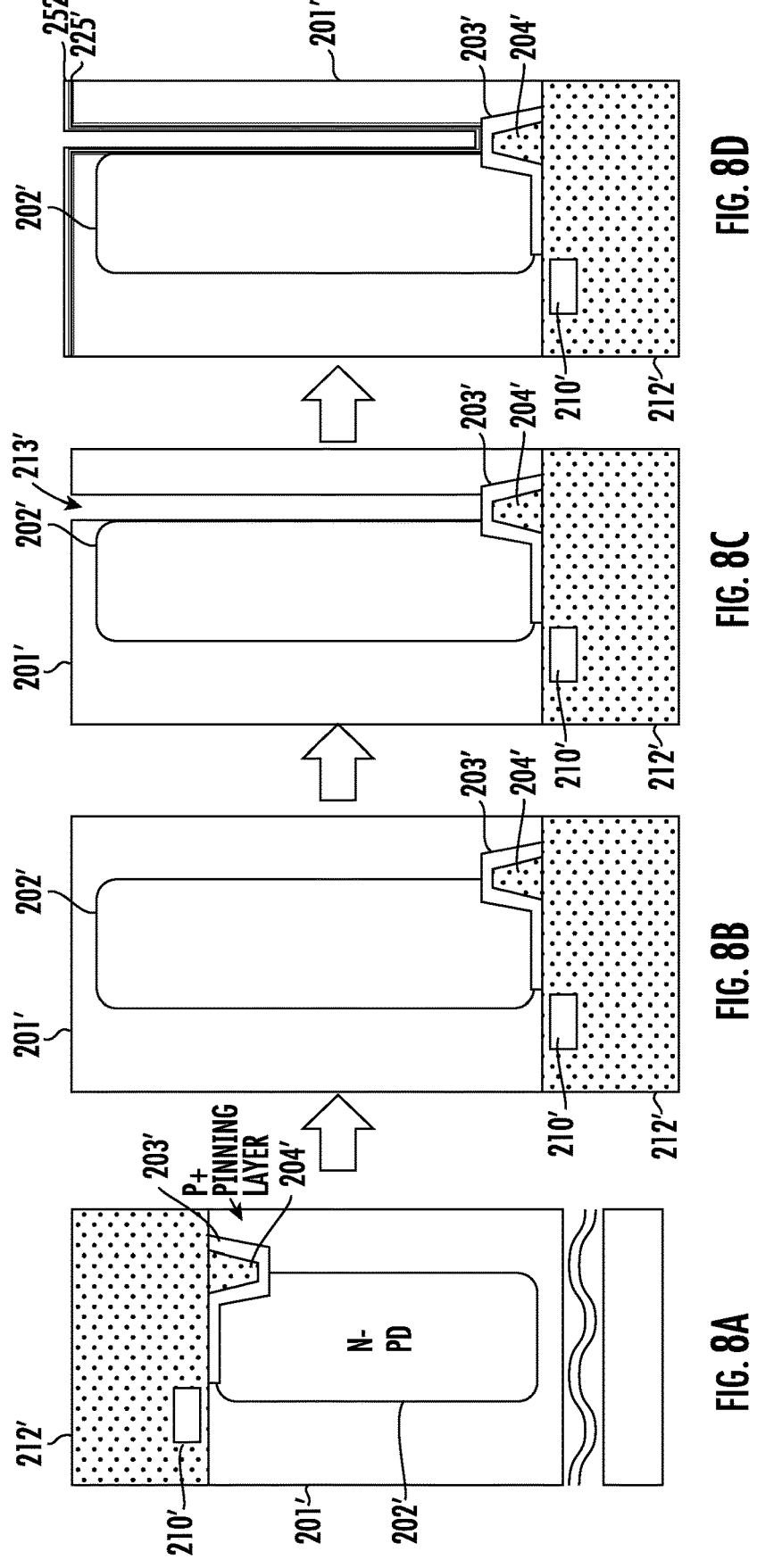
FIGS. 8A-8E are a series of cross-sectional diagrams illustrating another method of making an image sensor device in accordance with an example embodiment.
Figure 8E:
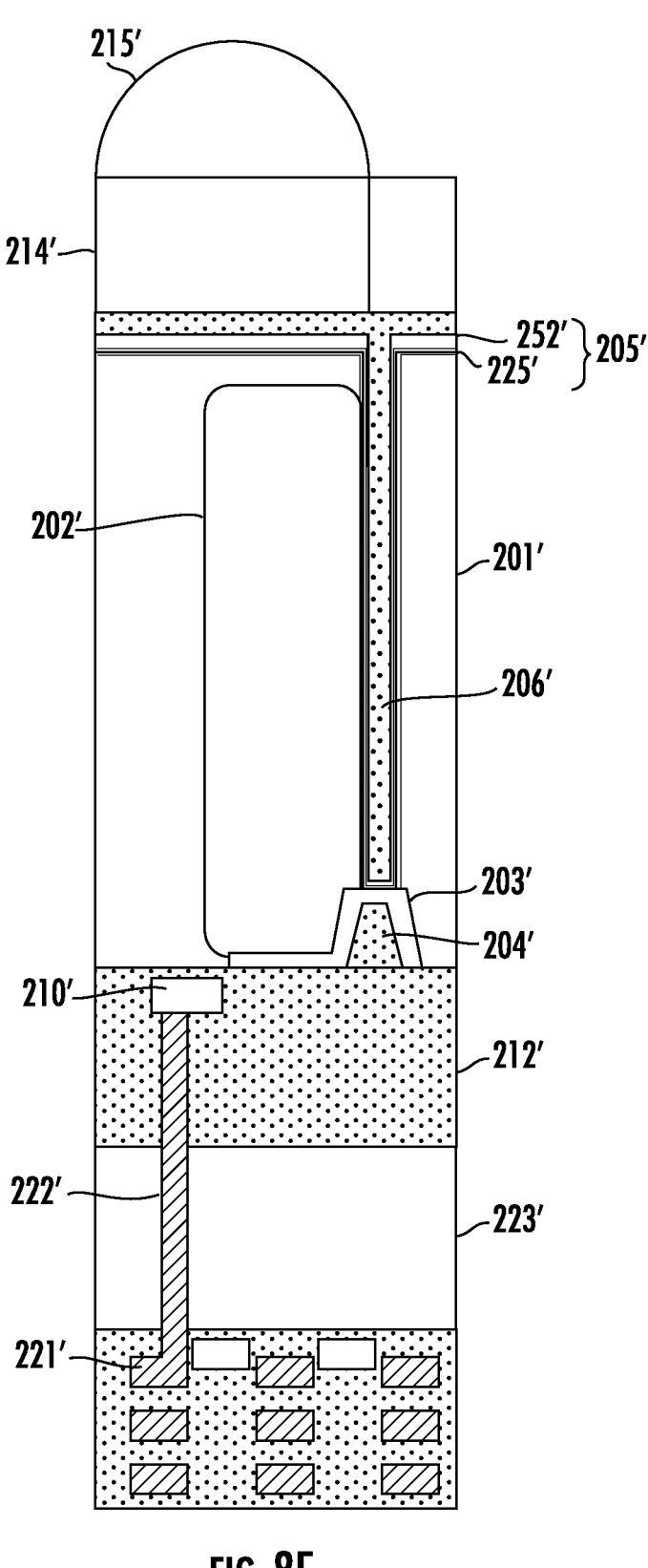

Turning to FIGS. 7A-7E, one example approach for making an image sensor device 200 is now described. Front side processing is first performed to define the pixel region 202, first pinning layer 203 and STI region 204, in addition to a gate 210 and metal interconnect layers within an insulating layer 212 (FIG. 7A). The wafer is then bonded to a handling wafer (not shown) and flipped for backside thinning (FIG. 7B). Deep trench patterning may then be performed, here resulting in a deep trench 213 adjacent the right side of the pixel region 202 in the illustrated example.

Formation of the second pinning layer 205 is shown in FIG. 7C. Native oxide removal is performed, such as by remote plasma $NH_3+NF_3$ and at a temperature in a range of 150-250° C., for example. Next, hydrogen passivation of the Si surface is performed, such as with remote plasma $H_2$ at a temperature in a range of 350-500° C., for example. The superlattice 225 may then be formed by epitaxial Si monolayer deposition with inserted oxygen monolayers (in the case of an Si/O superlattice). By way of example, an Si epitaxy process may be performed at a temperature in a range of 400-550° C. with $Si_2H_6$ or $Si_3H_8$. Sub-monolayer oxygen doping may be performed at a temperature in a rage of 500-600° C. with diluted $O_2$ in one implementation. In another example implementation, oxygen monolayer doping may be achieved at a temperature in a range of 250-550° C. with remote plasma $O_2$, for example.

In-situ boron doped Si epitaxy may then be performed to form the semiconductor layer 252 to a thickness in a range of about 5-30 nm and at a temperature in a range of 350-450° C., for example. Example source gases which may be used include $B_2H_6+Si_2H_6$ or $Si_3H_6$ to provide a boron concentration in a range of 5E18-1E20/cm$^3$, for example. In embodiments where fluorine is included for passivation as discussed above, in-situ fluorine doped Si epitaxy may be performed at a temperature in a range of 400-550° C. with $Si_2H_6$ or $Si_3H_6$, for example. Sub-monolayer fluorine doping may be performed using different approaches, e.g., at a temperature of 200-400° C. with diluted $SF_6$, for example. Another approach is the use of remote plasma $NF_3$ at a temperature in a range of 250-550° C., for example.

The trench 213 may then be filled with an insulator to form the DTI region 206, e.g., atomic layer deposition (ALD) $SiO_2$ deep trench fill. Color filter 214 deposition is then performed, followed by lens formation (FIG. 7E) to complete the illustrated image sensor device 200.

In accordance with another example approach now described with reference to FIGS. 8A-8E, the above-noted metal interconnect layers 211 may be replaced with metal layers 221 that are further separated or spaced apart from the pixel region 202'. This approach may advantageously avoid the need for low temperature epitaxial processing, allowing a regular epitaxial process to instead by used. More particularly, formation of the second pinning layer 205' may begin with native oxide removal, such as with a DHF wet etch. Hydrogen passivation of the Si surface may be performed with an $H_2$ bake at a temperature in a range of 800-900° C. Furthermore, epitaxial superlattice film growth with Si and oxygen monolayer doping may involve Si epitaxial processing at a temperature in a range of 600-800° C. with $Si_2H_6$ or $Si_3H_6$, for example, followed by sub-monolayer oxygen doping as described further above. In-situ boron doped Si epitaxial processing may be performed to achieve a thickness in a range of 5-30 nm at a temperature in a range of 600-800° C., providing a boron concentration in a range of 5E18-1E20/cm$^3$, for example. When fluorine passivation is to be used for interface passivation, then in-situ fluorine-doped Si epitaxy may be performed using an Si epitaxy process at a temperature in a range of 600-800° C. with $Si_2H_6$ or $Si_3H_8$, and sub-monolayer fluorine doping may be performed at a temperature in a range of 250-550° C. with thermal $NF_3$.

A wafer including a semiconductor substrate 223' and an insulation layer 224' having contact metal layers 221' therein is bonded to the backside of the insulating layer 212. A conductive via 222' electrically connects the transfer gate 210' to the appropriate metal layer(s) 221', as shown.

Figure 9:
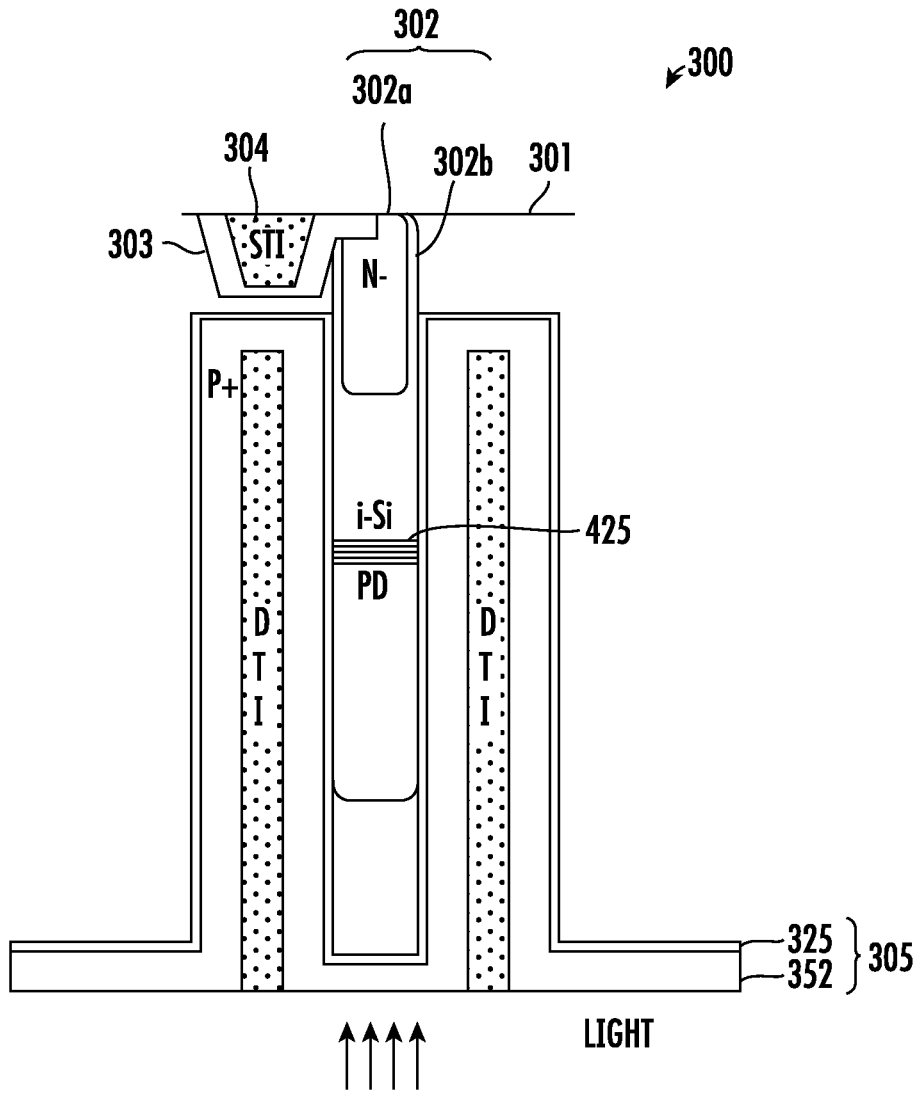
FIG. 9 is a schematic cross-sectional diagram of another image sensor device in accordance with an example embodiment.

Turning now to FIG. 9, another example image sensor device 300 illustratively includes a semiconductor substrate 301, and a pixel region 302 within the semiconductor substrate. More particularly, the pixel region 302 illustratively includes a doped region 302a with a first dopant having a first conductivity type (N-type in the present example), and an intrinsic (undoped) region 302b. A first pinning layer 303 on a surface of the substrate 301 includes a second dopant having a second conductivity type different from the first conductivity type (P-type in the present example). An STI region 304 is within the first pinning layer 303. Furthermore, a second pinning layer 305 in the semiconductor substrate 301 is adjacent one or more sides of the pixel region 302 and illustratively includes a superlattice 325 with a semiconductor layer 352 also having the second dopant. The superlattice 325 may be as described further above.

In the illustrated example, the second pinning layer 305 extends along DTI regions 306, the pixel region 302, and backside regions of the device 300, which as described above provides several advantages over conventional approaches. As also noted above, the second pinning layer 305 may be formed as a P+ pinning layer by in-situ boron doped Si epitaxy after a deep trench etch, and the second (P+) pinning layer 305 incorporates the superlattice layer 325 to advantageously provide for dopant diffusion blocking as between the second pinning layer and the pixel region 302, as well as to help retain these dopants in place to maintain desired operating characteristics.

The image sensor device 300 accordingly provides a pinned photodiode plus a P-I-N photodiode as a result of the physical separation of the first pinning layer 303 and the second pinning layer 305 (as compared to the first pinning layer 103 and second pinning layer 105 which are in physical contact in the image sensor device 100), as well as the insertion of the intrinsic region 302b between the N region 302a and P pinning layer 305. That is, the intrinsic region 302b physically separates the doped region 302a from the second pinning layer 305. The intrinsic region 302b may include i-Si, SiGe, Si/SiGe, a Si/Ge stack, etc., or combination of such materials, along with a superlattice (MST) layer 425 for enhancement of IR light.

More particularly, bulk Si alone has a relatively poor absorption in a wavelength range from 1.3~1.55 um. Yet, incorporating the superlattice 425 within the PIN diode intrinsic region 302b provides a significant technical advantage, in that the MST superlattice material can enhance IR absorption and improve quantum efficiency. For example, ab-initio calculations project an increase in IR light absorption by ~1,000× for a Si region with an incorporated MST film over bulk Si alone. In an example configuration, the N– region 302a may be connected to a transfer gate transistor, and the second pinning layer 305 tied to ground. In one example implementation, the intrinsic region 302b may include i-Si, i-SiGe or i-SiC along with the superlattice 425 to enhance IR absorption.

Figure 10:
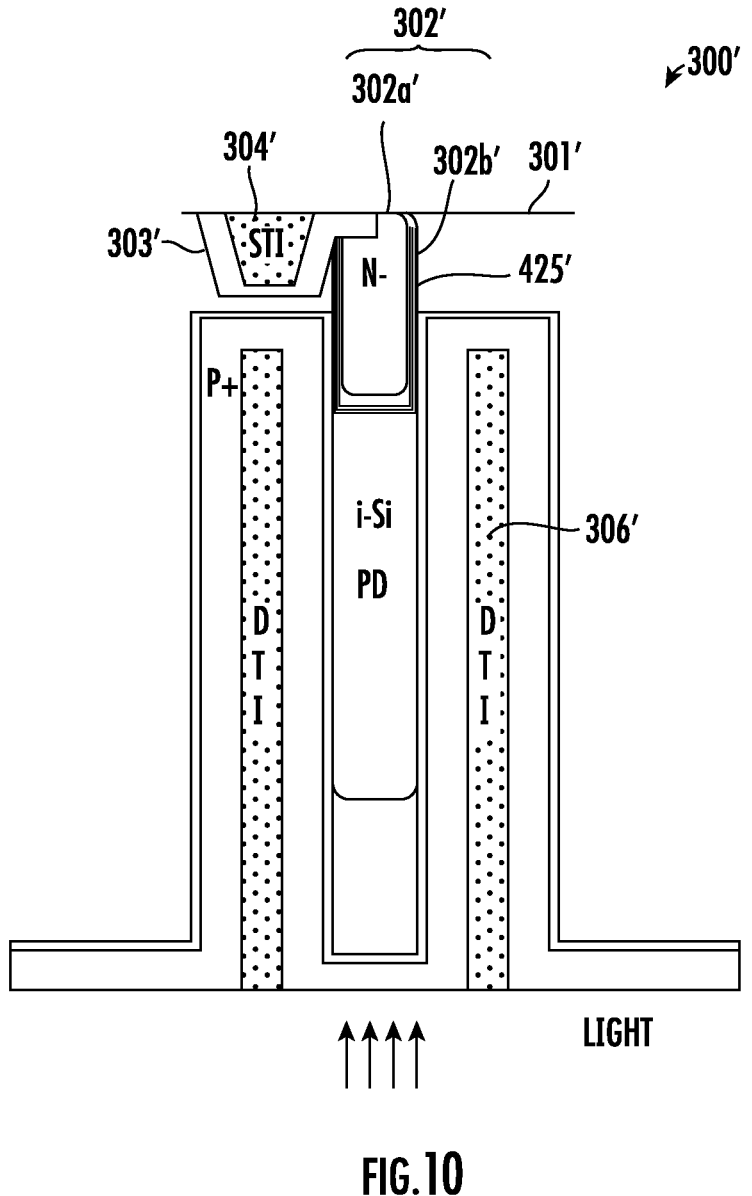
FIG. 10 is a schematic cross-section diagram of an alternative embodiment of the image sensor device of FIG. 9.

Turning now to FIG. 10, an image sensor device 300' provides another example PIN diode with DTI structure, but here the superlattice layer 425' surrounds or at least partially surrounds the N– region 302a'. By way of background, doping profiles in intrinsic devices typically need to be optimized such that the electron-hole generation region remains intrinsic during operation. Phosphorus diffusion in Ge is extremely fast, resulting in non-abrupt junctions and higher dopant concentrations in intrinsic regions, which effectively increases device capacitance. However, the device 300' advantageously leverages the superlattice film 425' in the intrinsic region 425' as a diffusion blocking layer to reduce such diffusion. As noted above, the N– region 302a' may be connected to a transfer gate transistor, and the second pinning layer 305' tied to ground. Once again, the intrinsic region 302b' may include i-Si with the superlattice 425', and in another example implementation the intrinsic region 302b' may include i-Si, i-SiGe or i-SiC along with the superlattice 425' to enhance IR absorption.

By way of background, PIN diodes are used for converting light energy into electrical energy. A PIN diode has a large depletion region which improves its performance by increasing the volume of light conversion, and it is used in a reverse bias mode. A photocurrent Iph corresponds to the amount of photons which are absorbed in the i-layer to generate the electron-hole pairs, where Vsignal=Iph·Rload. With regard to Ge PIN photodiodes, conventionally a photo detector incorporating a compound semiconductor based material, such as InGaAs, has been used for wavelengths in a range from the 1.3 μm band to the 1.55 μm band. However, the image sensor devices 300, 300' advantageously allow for the use of SiGe or Ge along with one or more MST superlattice films in the intrinsic regions 302b, 302b' to advantageously provide desired sensitivity at wavelengths ranging from the 1.3 μm band to the 1.55 μm band, yet in a relatively low cost photo-detector compared to the above-noted conventional photo detectors. By way of example, near-infrared image sensors realized by the embodiments presented herein may be used in applications such as IoT devices, robotics, AR/VR, etc.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making an image sensor device comprising:

forming a pixel region within a semiconductor substrate and comprising a first dopant having a first conductivity type;

forming a first pinning layer on a surface of the substrate and comprising a second dopant having a second conductivity type different than the first conductivity type; and forming a second pinning layer in the semiconductor substrate adjacent at least one side of the pixel region and comprising a superlattice and the second dopant, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The method of claim 1 wherein the second pinning layer extends along opposite sides of the pixel region.

3. The method of claim 2 wherein the second pinning layer extends along a bottom of the pixel region.

4. The method of claim 1 further comprising forming an isolation region in the semiconductor substrate adjacent the second pinning layer.

5. The method of claim 4 wherein the second pinning layer wraps around the isolation region.

6. The method of claim 1 wherein the first pinning layer is adjacent a first end of the pixel region; and further comprising forming a color filter layer on the substrate adjacent a second end of the pixel region opposite the first end.

7. The method of claim 6 further comprising forming a lens on the color filter layer.

8. The method of claim 1 further comprising:

forming a transfer gate adjacent the first pinning layer;

forming a conductive contact spaced apart from the transfer gate; and forming a conductive via extending between the transfer gate and the conductive contact.

9. The method of claim 1 wherein the second pinning layer further comprises fluorine.

10. The method of claim 1 wherein the base semiconductor portion comprises silicon.

11. The method of claim 1 wherein the at least one non-semiconductor monolayer comprises oxygen.

12. The method of claim 1 wherein forming the pixel region comprises forming an intrinsic region, and forming a doped region including the first dopant in the intrinsic region with the intrinsic region separating the doped region and the second pinning layer.

13. The method of claim 12 wherein the superlattice comprises a first superlattice; and wherein forming the pixel region further comprises forming a second superlattice in the intrinsic portion, the second superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

14. The method of claim 13 wherein the second superlattice at least partially surrounds the doped region in some implementations.

15. A method for making an image sensor device comprising:

forming a pixel region within a semiconductor substrate comprising a first dopant having a first conductivity type;

forming a first pinning layer on a surface of the substrate and comprising a second dopant having a second conductivity type different than the first conductivity type;

forming a second pinning layer in the semiconductor substrate adjacent at least one side of the pixel region and comprising a superlattice and the second dopant, the superlattice comprising a plurality of stacked groups of layers, each group of layers comprising a plurality of stacked base semiconductor monolayers defining a base semiconductor portion, and at least one oxygen monolayer constrained within a crystal lattice of adjacent base semiconductor portions; and forming an isolation region in the semiconductor substrate adjacent the second pinning layer.

16. The method of claim 15 wherein the second pinning layer extends along opposite sides and a bottom of the pixel region.

17. The method of claim 15 wherein the second pinning layer wraps around the isolation region.

18. The method of claim 15 wherein the first pinning layer is adjacent a first end of the pixel region; and further comprising forming a color filter layer on the substrate adjacent a second end of the pixel region opposite the first end, and a lens on the color filter layer.

19. The method of claim 15 further comprising:

forming a transfer gate adjacent the first pinning layer;

forming a conductive contact spaced apart from the transfer gate; and forming a conductive via extending between the transfer gate and the conductive contact.

20. The method of claim 15 wherein the second pinning layer further comprises fluorine.

21. A method for making an image sensor device comprising:

forming a pixel region within a semiconductor substrate comprising a first dopant having a first conductivity type;

forming a first pinning layer on a surface of the substrate and comprising a second dopant having a second conductivity type different than the first conductivity type; and forming a second pinning layer in the semiconductor substrate adjacent at least one side of the pixel region and comprising a superlattice and the second dopant, the superlattice comprising a plurality of stacked groups of layers, each group of layers comprising a plurality of stacked base silicon monolayers defining a base silicon portion, and at least one oxygen monolayer constrained within a crystal lattice of adjacent base semiconductor portions.

22. The method of claim 21 wherein the second pinning layer extends along opposite sides and a bottom of the pixel region.

23. The method of claim 21 further comprising forming an isolation region in the semiconductor substrate adjacent the second pinning layer; and wherein the second pinning layer wraps around the isolation region.

24. The method of claim 21 wherein the first pinning layer is adjacent a first end of the pixel region; and further comprising forming a color filter layer on the substrate adjacent a second end of the pixel region opposite the first end, and forming a lens on the color filter layer.

25. The method of claim 21 further comprising:

forming a transfer gate adjacent the first pinning layer;

forming a conductive contact spaced apart from the transfer gate; and forming a conductive via extending between the transfer gate and the conductive contact.

26. The method of claim 21 wherein the second pinning layer further comprises fluorine.

* * * * *